United States Patent [19]
Bokisa

[11] Patent Number: 5,928,790
[45] Date of Patent: *Jul. 27, 1999

[54] MULTILAYER CIRCUIT BOARDS AND PROCESSES OF MAKING THE SAME

[75] Inventor: George S. Bokisa, North Olmsted, Ohio

[73] Assignee: McGean-Rohco, Inc., Cleveland, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 08/636,775

[22] Filed: Apr. 23, 1996

[51] Int. Cl.$^6$ .............................. B32B 15/08; B32B 27/38
[52] U.S. Cl. ........................... 428/416; 156/329; 427/96; 427/98; 428/447; 428/473.5; 428/702; 428/901
[58] Field of Search ........................ 427/96, 98; 156/329; 428/416, 447, 473.5, 702, 901

[56] References Cited

U.S. PATENT DOCUMENTS

| | | | |
|---|---|---|---|
| 3,348,990 | 10/1967 | Zimmerman et al. | 156/293 |
| 4,482,476 | 11/1984 | Yoshimura et al. | 252/511 |
| 4,499,152 | 2/1985 | Green et al. | 428/448 |
| 4,582,576 | 4/1986 | Opaskar et al. | 204/44.4 |
| 4,657,632 | 4/1987 | Holtzman et al. | 156/659.1 |
| 4,689,085 | 8/1987 | Plueddemann | 106/287.14 |
| 4,715,894 | 12/1987 | Holtzman et al. | 106/1.22 |
| 4,761,303 | 8/1988 | Ruszczyk et al. | 427/98 X |
| 4,871,429 | 10/1989 | Nobel et al. | 204/44.4 |
| 4,882,202 | 11/1989 | Holtzman et al. | 427/98 |
| 5,039,576 | 8/1991 | Wilson | 428/626 |
| 5,073,456 | 12/1991 | Palladino | 428/446 |
| 5,160,422 | 11/1992 | Nishimura et al. | 205/254 |
| 5,196,053 | 3/1993 | Dodd et al. | 106/1.22 |
| 5,211,831 | 5/1993 | Vitale et al. | 427/98 X |
| 5,217,751 | 6/1993 | King et al. | 427/98 |
| 5,435,838 | 7/1995 | Melton et al. | 106/1.22 |
| 5,554,211 | 9/1996 | Bokisa et al. | 106/1.22 |

FOREIGN PATENT DOCUMENTS

| | | |
|---|---|---|
| 310010 | 9/1988 | European Pat. Off. . |
| 657394 | 12/1994 | European Pat. Off. . |

OTHER PUBLICATIONS

Patent Abstract of Japan, JP 05 186878, Jul. 27, 1993.
EP 97 10 6635, Eureopean Search Report mailed Aug. 21, 1997.

*Primary Examiner*—Michael Lusignan
*Attorney, Agent, or Firm*—Renner, Otto, Boisselle & Sklar

[57] ABSTRACT

This invention relates to a process for improving the adhesion of copper circuitry to a dielectric layer and a method for forming a multilayer printed circuit board wherein the copper circuitry of the board is covered with a layer of an oxide, hydroxide, or combination thereof of a metal selected from the group consisting of tin, bismuth, lead, indium, gallium, germanium, and alloys of said metals. The process and multilayer circuit boards made thereby, have improved laminate adhesion and strength. Further, partial delamination, known as pink ring, is decreased or avoided by the present process. Further, the multilayer structures have decreased bond strength deterioration when exposed to elevated temperatures.

44 Claims, 1 Drawing Sheet

MULTILAYER CIRCUIT BOARDS AND PROCESSES OF MAKING THE SAME

FIELD OF THE INVENTION

This invention relates to a process for preparing multilayer printed circuit boards and boards made thereby and a process for improving adhesion between copper circuitry and a dielectric layer.

BACKGROUND OF THE INVENTION

Multilayer printed circuit boards (PCB's) are typically constructed by interleaving imaged conductive layers such as one containing copper with non-conductive layers such as a partially cured B-stage resin, i.e., a prepreg, into a multilayer sandwich which is then bonded together by applying heat and pressure. The conductive layer, e.g., copper circuitry, does not bond well to the non-conductive B-stage resin prepreg. Often intermediate layers are used to bond the B-stage prepreg to the copper circuitry.

In the formation of multilayer circuit boards, it is often necessary to drill holes through the boards, and defects can occur due to delamination of layers in the areas immediately surrounding a hole. Additionally, hole cleaning chemicals (typically acidic or reductive) can remove the bonding metal oxide-metal hydroxide layer. This removal leads to partial delamination, known as pink ring. When the multilayer structures are exposed to elevated temperatures for extended periods of time, decay of the bond strength may occur. It is desirable to have materials which can be used to prepare multilayer structures without the above problems.

U.S. Pat. No. 4,499,152, issued to Green et al, relates to metal-clad laminate construction. The laminate is useful in high resolution printed circuit patterns. The laminate preferably comprises a resin-bonded, glass-reinforced substrate, a layer of coupling agent covering and bonded to the major surface of the substrate, a layer of ultra-thin copper adjacent the layer of coupling agent, and a composite bonding layer disposed between the copper layer and the layer of coupling agent. The composite bonding layer comprises copper alloy with at least one non-copper metal and oxide material of non-copper metal. The aluminum sheet carrier material is covered with a thin film of copper by vapor deposition. The thin film of copper is then coated with a thin layer of a metal oxide or mixture of metal oxides.

U.S. Pat. No. 4,882,202, issued to Holtzman et al, relates to the use of immersion tin and tin alloys as bonding media for multilayer circuits. Holtzman et al disclose a method for improving the adhesion of printed circuit boards to one another in a multilayer board using an immersion tin composition containing urea compounds.

U.S. Pat. No. 5,073,456, issued to Palladino, relates to multilayer printed circuit board. The multilayer printed circuit boards, having a number of through-holes, are prepared by forming an electrically conductive copper circuitry on the surface of a dielectric material and forming a layer of oxide, hydroxide or combinations thereof of tin on the copper circuitry, applying a silane bonding mixture to the surface of the metal oxide, metal hydroxide or combination thereof layer or to an insulating layer to be bonded to the copper circuitry, wherein the insulating layer comprises a partially cured thermosetting polymer composition and the silane bonding mixture consists essentially of a ureido silane and a disylyl crosslinking agent. A number of through holes are formed in the bonded article and the walls of the through holes are metalized to form electrically conductive paths.

SUMMARY OF THE INVENTION

This invention relates to a process of improving adhesion of copper circuitry to a dielectric layer, comprising the steps of: (A) providing a dielectric support having conductive copper circuitry on one or two opposite surfaces of the dielectric support; (B) forming, on the copper circuitry, a layer of an oxide, hydroxide, or combination thereof of a metal selected from the group consisting of tin, bismuth, lead, indium, gallium, germanium, and alloys of said metals, wherein the metal is deposited on the copper circuitry by application of an aqueous plating solution of said metals or alloys thereof onto the copper circuitry wherein said plating solution comprises: (B-1) at least one solution-soluble metal salt selected from the group consisting of a tin salt, a lead salt, a bismuth salt, an indium salt, a gallium salt and a germanium salt; (B-2) at least one acid selected from the group consisting of fluoboric acid, alkane sulfonic acids, alkanol sulfonic acids, and mixtures thereof; (B-3) a complexing agent which is an imidazole-2-thione compound of the Formula

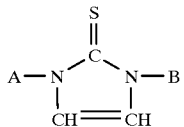

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (B-4) water; and the metal so deposited is converted on its surface to an oxide hydroxide or combination thereof; (C) (i) applying, sequentially, an organosilane bonding mixture and an insulating layer to the surface the oxide, hydroxide, or combination thereof, or (iii) applying an organosilane coated insulating layer to the surface of the metal oxide, metal hydroxide, or combination thereof, wherein the insulating layer comprises a partially cured thermosetting polymer composition and wherein the organosilane coating is between the surface of the metal oxide, metal hydroxide, or combination thereof and the insulating layer and wherein the surface of the insulating layer opposite the organosilane bonding layer optionally contains copper circuitry, (D) bonding the combination from steps (A), (B), and (C), whereby during bonding, the partially cured insulating layer are cured.

Another aspect of the invention is directed to a process for forming a multilayer printed circuit board containing conductive through-holes which make electrical connections to a series of electrically conducting layers through one or more insulating layers comprising the steps of: (A) providing a dielectric layer having electrically conductive copper circuitry on one or two opposite surfaces of the dielectric layer support; (B) forming on the copper circuitry, a layer of an oxide, hydroxide, or combination thereof of a metal selected from the group consisting of tin, bismuth, lead, indium, gallium, germanium, and alloys of said metals, wherein the metal is deposited on the copper circuitry by application of an aqueous plating solution of said metals or alloys thereof onto the copper circuitry wherein said plating solution comprises: (B-1) at least one solution-soluble metal salt selected from the group consisting of a tin salt, a lead salt, a bismuth salt, an indium salt, a gallium salt and a germanium salt; (B-2) at least one acid selected from the group consisting of fluoboric acid, alkane sulfonic acids, alkanol sulfonic acids, and mixtures thereof; (B-3) a complexing agent which is an imidazole-2-thione compound of the Formula

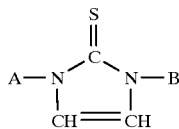

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (B-4) water; and the metal so deposited is converted on its surface to an oxide hydroxide or combination thereof; (C) (i) applying, sequentially, an organosilane bonding mixture and an insulating layer to the surface the metal oxide, metal hydroxide, or combination thereof, or (ii) applying an organosilane coated insulating layer coated on one side with an organosilane bonding mixture to the surface of the metal oxide, metal hydroxide, or combination thereof, wherein the insulating layer comprises a partially cured thermosetting polymer composition and wherein the organosilane coating is between the surface of the metal oxide, metal hydroxide, or combination thereof and the insulating layer and wherein surface of the insulating layer opposite the organosilane bonding optionally contains copper circuitry, (D) repeating steps (A), (B) and (C) provided that when the insulating layer in step (C) has copper circuitry on the side opposite the organosilane at least one insulating layer separates the copper circuitry, and steps (B) and (C) are repeated, (E) bonding the materials formed in step (D) into a single article whereby an organosilane coating is between the layers of the metal oxide, metal hydroxide or combination thereof and the insulating layers and whereby during bonding, the partially cured insulating layers are cured; (F) forming a number of holes through the bonded article formed in step (E); and (G) metallizing the walls of the through holes to form electrically conductive paths from opposite openings of the through holes to form a multilayer circuit board.

In another aspect the invention also relates to a multilayer printed circuit board containing conductive through-holes which make electrical contact to a series of electrically conducting layers through one or more insulating layers comprising: (A) a dielectric layer; (B) a copper circuitry on one or two opposite sides of the dielectric layer; (C) a layer of metal oxide, metal hydroxide, or combination thereof which overlays the copper circuitry wherein the metal is selected from the group consisting of bismuth, lead, indium, gallium, germanium, alloys of said metals and alloys of said metals and tin; (D) an organosilane layer over the layer of metal oxide, metal hydroxide or combination thereof; (E) an insulating layer comprising a cured thermosetting polymer composition over the organosilane layer.

In another aspect, the multilayer printed circuit board containing conductive through-holes which make electrical contact to a series of electrically conducting layers through several insulating layers comprises (A) a dielectric layer; (B) a layer of copper circuitry on one or on two opposite sides of the dielectric layer; (C) a layer of metal oxide, metal hydroxide, or combination thereof which overlays the copper circuitry wherein the metal is selected from the group consisting of bismuth, lead, indium, gallium, germanium, alloys of said metals and alloys of said metals and tin; (D) an organosilane layer which overlays the layer of metal oxide, metal hydroxide or combination thereof; (E) an insulating layer comprising a cured thermosetting polymer composition over the organosilane layer; (F) a second layer of copper circuitry on the side of the insulating layer; (G) a second layer of metal oxide, metal hydroxide or combination thereof which overlays the second layer of copper circuitry wherein the metal is selected from the group consisting of bismuth, lead, indium, gallium, germanium, alloys of said metals and alloys of said metals and tin; (H) a second organosilane layer which overlays the second layer of metal oxide, metal hydroxide or combination thereof; and (I) a second insulating layer comprising a cured thermosetting polymer composition over the organosilane layer provided that second layers (F) through (I) are optional when layers (B), (C), (D) and (E) are present on opposite sides of the dielectric layer (A).

Another aspect of the invention is a multilayer printed circuit board containing conductive through-holes which make electrical contact to a series of electrically conducting layers through several insulating layers comprising in sequence: (A) a dielectric layer; (B) a layer of copper circuitry; (C) a layer of metal oxide, metal hydroxide or combination thereof which overlays the copper circuitry wherein the metal is selected from the group consisting of bismuth, lead, indium, gallium, germanium, alloys of said metals and alloys of said metals and tin; (D) an organosilane layer which overlays the layer of metal oxide, metal hydroxide or combination thereof; (E) an insulating layer comprising a cured thermosetting polymer composition; (F) a second organosilane layer; (G) a second layer of a metal oxide, metal hydroxide, or combination thereof wherein the metal is selected from the group consisting of bismuth, lead, indium, gallium, germanium and alloys of said metals; (H) a second layer of copper circuitry; and (I) a second dielectric layer.

Another aspect of the invention is a multilayer printed circuit board containing conductive through-holes which make electrical contact to a series of electrically conducting layers through several insulating layers comprising in sequence: (A) a dielectric layer; (B) a layer of copper circuitry; (C) a layer of metal oxide, or metal hydroxide, or combination thereof which overlays the copper circuitry wherein the metal is selected from the group consisting of bismuth, lead, indium, gallium, germanium, alloys of said metals and alloys of said metals and tin; (D) an organosilane layer; (E) an insulating layer comprising a cured thermosetting polymer composition; (F) a second layer of copper circuitry; (G) a second layer of metal oxide, metal hydroxide or combination thereof which overlays the second layer of copper circuitry wherein the metal is selected from the group consisting of bismuth, lead, indium, gallium, germanium, alloys of said metals and alloys of said metals and tin; (H) a second organosilane layer; and (I) a second insulating layer comprising a cured thermosetting polymer composition.

The process of the present invention provides improved adhesion of copper circuitry to organosilane bonding materials. Also, the process provides multilayer circuit boards having improved laminate adhesion and strength. Further, partial delamination, known as pink ring, is decreased or avoided by the present process. Further, the multilayer structures have decreased bond strength deterioration when exposed to elevated temperatures.

DETAILED DESCRIPTION OF THE PREFERRED EMBODIMENTS

Figure 1:
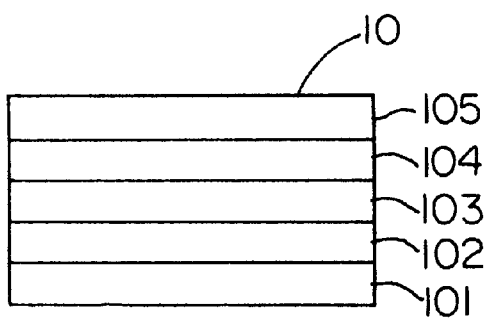
FIG. 1 is a cross-sectional area of a multilayer structure used to make a multilayer printed circuit board.

The present invention relates to a process of improving adhesion of copper circuitry to a dielectric layer. The present invention also relates to a process for preparing multilayer circuit boards and to multilayer circuit boards prepared therefrom. Multilayer PCB's are typically constructed by combining conductive layers such as one containing copper circuitry with adhesive layers into a multilayer sandwich which is then bonded together by applying heat and pressure. Production of these types of PCB's is described in "Printed Circuits Handbook," Third Edition, Edited by C. F. Coombs, Jr., McGraw-Hill, 1988, which is incorporated herein by reference. Often, through holes are formed in the boards and the walls of the through holes are metallized to complete the electrical circuit with the copper circuitry.

The dielectric layer is a non conductive support material. The dielectric layer may be prepared from thermosetting resins, such as epoxy resins, acrylic resins, polyester resins, fluorocarbon polymers, nylon polymers, polyimides, polycyanate esters and polybutadiene terephthalate resins. Useful dielectric layers are disclosed in U.S. Pat. No. 4,499,152, and such disclosure is hereby incorporated by reference.

On the dielectric layer is copper circuitry. The copper circuitry may be on one or both surfaces of the dielectric layer. The copper circuitry typically has a thickness of at least about 2 microns or about 4 microns. Generally, the copper circuitry has a thickness from about 2 to about 40, or from 3 to about 16, or from 4 to about 8 microns. The copper circuitry may be placed on the dielectric layer by any means known to those in the art. An example of such technique is photo imaging of a photo sensitive resist film followed by etching of unprotected areas of copper. An example of a suitable technique is disclosed in U.S. Pat. No. 3,469,982, which is incorporated by reference.

The copper circuitry is covered by a layer of metal oxide, metal hydroxide, or combination thereof. This layer generally has a thickness of less than about 1.5 microns, or less than about 1 micron. The thickness may typically be from about 0.1 to about 0.8, or from about 0.15 to about 0.5, or from about 0.15 to about 0.25 microns. Here, as well as elsewhere in the specification and claims, the range and ratio limits may be combined. The metals of this layer include one or more metals selected from tin, lead, bismuth, indium, gallium, germanium, and alloys thereof. Particularly useful metals include bismuth, lead, indium, gallium, germanium, alloys of said metals and alloys of said metals and tin. Thus, the metal oxide, metal hydroxide or combination thereof layer may contain tin, lead, bismuth, indium, gallium and germanium, or mixtures of metals such as bismuth/tin, bismuth/lead, bismuth/indium, lead/tin, germanium/tin, indium/tin, indium/gallium, bismuth/lead/tin, gallium/germanium/tin, bismuth/tin/germanium, etc. Tin oxide and tin hydroxide layers are disclosed in U.S. Pat. No. 5,073,456, which is incorporated herein by reference.

The metal oxide, metal hydroxide or combination thereof may be deposited on the copper circuitry by means known to those in the art. For instance, the metals may be deposited from urea or urea derivative, homologue or analog thereof based immersion coating baths. The urea or urea derivative, homologue or analog thereof may be used in place of or in addition to the imidazole-2-thione compound in the baths described below. Examples of useful urea derivatives are found in Cols. 14–15 in Holtzman et al, U.S. Pat. No. 4,657,632, which is incorporated herein by reference. Specific examples include urea nitrate, urea oxalate, 1-acetylurea, 1-benzylurea, 1-butylurea, 1,1-diethylurea, 1,1-diphenylurea, 1-hydroxyurea, thiourea, etc. Urea is preferred. In one embodiment, the plating solutions of this invention are substantially free of thiourea and thiourea derivatives. Examples of immersion coating baths are disclosed in U.S. Pat. Nos. 4,882,202, issued to Holtzman et al, and 5,073,456, issued to Palladino. These patents are incorporated by reference for their disclosure of plating baths and methods of using the same.

In a preferred embodiment, one or more metals selected from the group consisting of tin, lead, bismuth, indium, gallium and germanium, and alloys of said metals, may be deposited onto the copper circuitry utilizing an aqueous electroless plating solution which comprises (A) at least one solution-soluble metal salt selected from the group consisting of a stannous salt, a lead salt, a bismuth salt, an indium salt, a gallium salt, a germanium salt and mixtures of two or more thereof; (B) at least one acid selected from the group consisting of fluoboric acid, alkane sulfonic acids, alkanol sulfonic acids, and mixtures thereof; (C) a complexing agent which is an imidazole-2-thione compound of the Formula

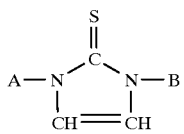

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (D) water. Optionally, the aqueous plating solutions may contain one or more surfactants.

The metals are present in the plating bath as water-soluble salts including the oxides, nitrates, halides, acetates, fluoborates, fluosilicates, alkane sulfonates and alkanol sulfonates. The metals are discussed above. In one preferred embodiment, the anion of the metal salt corresponds to the anion of the acid used in the plating bath. For example, when fluoboric acid is used as the acid, the salts may be, for example, stannous fluoborate, lead fluoborate, bismuth fluoborate, indium fluoborate, gallium fluoborate and germanium fluoborate. When the acid used in the bath is an alkane or an alkanol sulfonic acid, the soluble metal salt may be, for example, lead methane sulfonate, bismuth methane sulfonate, indium methane sulfonate, etc.

The amount of tin, lead, bismuth, indium, gallium, germanium, or mixtures of such metals present in the plating solutions of the preferred embodiment may be varied over a wide range such as from about 1 to about 75 or even 100 grams of metal per liter of solution. In a preferred embodiment, the preferred range is from about 5 to about 50 and more often from about 6 to about 25 grams of metal per liter of solution. Higher levels of metal may be included in the plating solutions, but economics dictate that the metal levels be maintained at the lower levels.

A second component of the plating solutions of the preferred embodiment is at least one acid selected from the group consisting of fluoboric acid, alkane sulfonic acids, alkanol sulfonic acids, and mixtures thereof. The amount of acid contained in the solutions may vary from about 20 to about 400 grams of acid per liter of solution. More often, the plating solutions will contain from about 80 to about 150 grams of acid per liter of solution. Sufficient acid is present in the aqueous plating solutions to provide the solution with a pH from about 0 to about 3, more often from about 0 to about 2. Generally, it is desirable to use an acid that has an anion common to the acid salts of the metals.

The alkane sulfonic acids which are useful in the preferred embodiment as the anion of the metal salts or as the acid component may be represented by the following formula $$R-SO_3H$$

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Metal salts, such as salts of tin, bismuth, indium, gallium, germanium and mixtures of two or more thereof, of the individual alkane sulfonic acids or mixtures of any of the above alkane sulfonic acids can be utilized.

The alkanol sulfonic acids may be represented by the following formula:

$$(C_nH_{2n+1})-CH(OH)-(CH_2)_m-SO_3H$$

wherein n is from 0 to about 10, m is from 1 to about 11 and the sum of m+n is from 1 up to about 12. The hydroxy group of the alkanol sulfonic acids may be a terminal or internal hydroxy group. Examples of useful alkanol sulfonic acids include 2-hydroxyethyl-1-sulfonic acid, 1-hydroxypropyl-2-sulfonic acid, 2-hydroxypropyl-1-sulfonic acid, 3-hydroxypropyl-1-sulfonic acid, 2-hydroxybutyl-1-sulfonic acid, 4-hydroxybutyl-1-sulfonic acid, 2-hydroxypentyl-1-sulfonic acid, 4-hydroxypentyl-1-sulfonic acid, 2-hydroxyhexyl-1-sulfonic acid, 2-hydroxydecyl-1-sulfonic acid, 2-hydroxydodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula $R_1S_nR_2$ wherein $R_1$ or $R_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent. The metal salts of such acids are prepared, for example, by dissolving a metal oxide in a hot concentrated aqueous solution of an alkane or alkanol sulfonic acid. Mixtures of any of the above-described acids may be used, and an example of a useful mixture is a mixture of fluoboric acid and methane sulfonic acid.

A third component of the aqueous plating solutions of the preferred embodiment is (C) a complexing agent which is an imidazole-2-thione compound of the Formula

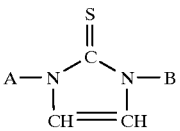

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as (where A is methyl or ethyl and B is an alkyl or cycloalkyl group containing from 3 to 6 carbon atoms). Preferably, when A is methyl, B is a $C_3-C_6$ alkyl or cycloalkyl group, and when A is ethyl, B is a $C_4-C_6$ alkyl or cycloalkyl group. An example of an unsymmetrical compound is 1-methyl-3-propylimidazole-2-thione.

Alternatively, symmetrical 1,3-dialkylimidazole-2-thione compounds may be utilized in the plating solutions and the dialkyl groups are the same alkyl or cycloalkyl groups containing from 1 to 6 carbon atoms. An example of this class of complexing agents is 1,3-dimethylimidazole-2-thione.

The amount of complexing agents included in the plating solutions may range from about 5 grams per liter up to the solubility limit of the complexing agent in the plating solution. Generally, the plating solution will contain from about 5 to about 100 grams of complexing agent per liter, and more often from about 40 to about 80 grams per liter. When the solubility of the complexing agent is low, a cosolvent may be added to solubilize the complexing agent and thereby enhance its activity in the resulting solution. Suitable cosolvents include water-miscible solvents such as alcohols (e.g., ethanol), glycols (e.g., ethylene glycol), alkoxy alkanols (2-butoxy ethanol), ketones (e.g., acetone), aprotic solvents (e.g., dimethylformamide, dimethylsulfoxide, acetonitrile, etc.), etc.

The metal plating solutions may also contain one or more chelating agents useful in keeping the displacement and/or displaced metal in solution. The chelating agents which are useful in the solutions of the present invention generally comprise the various classes of chelating agents and specific compounds disclosed in Kirk-Othmer, Encyclopedia of Chemical Technology, Third Edition, Vol. 5, pp. 339–368. This disclosure is hereby incorporated by reference. Chelating agents that are especially preferred comprise polyamines, aminocarboxylic acids and hydroxy carboxylic acids. Some aminocarboxylic acids that may be used comprise ethylenediaminetetraacetic acid, hydroxyethyletylenediaminetriacetic acid, nitrilotriacetic acid, N-dihydroxyethylglycine, and ethylenebis (hydroxyphenylglycine). Hydroxy carboxylic acids that may be used comprise tartaric acid, citric acid, gluconic acid and 5-sulfosalicylic acid. Other useful chelating agents include polyamines such as ethylenediamine, dimethylglyoxime, diethylenetriamine, etc.

Various reducing agents that may be included in the metal plating solutions, and these generally comprise organic aldehydes whether saturated or unsaturated, aliphatic or cyclic, having up to about 10 carbon atoms. Lower alkyl aldehydes having up to about 6 carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to prevent oxidation of the metal salts to a higher oxidation state, e.g., tin (II) ion to tin (IV) ion, but also as a chelating agent and is especially useful for these reasons. Other useful reducing agents include hypophosphorous acid, dimethylamino borane, etc.

The various components of the aqueous plating solutions may be present at the concentrations described above. In one embodiment, the displacement plating solution will contain on a molar basis:
  about 1 to about 15 parts of the metal ion;
  about 10 to about 125 parts of the complexing agent compound; and
  about 1 to about 360 parts of the acid.
The solution also may contain on a molar basis:
  about 10 to about 125 parts of a urea compound;
  about 5 to about 40 parts of a chelating agent; and
  about 5 to about 110 parts of a reducing agent.
The solution concentrations may, of course, vary depending on the particular plating application intended. The plating solutions can be prepared by adding the components to water. The components can be added in any order.

The aqueous electroless plating solutions of the preferred embodiment may be utilized in the plating of copper circuitry using an immersion, a spray, a flood or a cascade application process. Preferably, copper circuitry is contacted with the plating solutions by immersing or dipping the copper circuitry into the plating solutions maintained at a temperature of from about 15° C. to about 70° C. More often, the temperature of the plating solution is in the range of from about 25° C. to about 35° C. The copper circuitry to be plated generally is maintained in the bath for about 1 to about 5 minutes to provide the desired plate quality and thickness such as plating thicknesses at least about 4 or at least about 32 microns. The plating solutions may be stirred mechanically or ultrasonically to accelerate the displacement reaction.

The following examples illustrate the plating solutions of the preferred embodiment. Unless otherwise indicated in the following examples and elsewhere in the specification and claims, all parts and percentages are by weight, temperatures are in degrees centigrade, and pressure is at or near atmospheric pressure.

|  | g/l |
|---|---|
| Example 1 | |
| tin as stannous methane sulfonate | 10 |
| methane sulfonic acid | 150 |
| 1-methyl-3-propylimidazole-2-thione | 85 |
| water | to 1 liter |
| Example 2 | |
| bismuth as bismuth methane sulfonate | 6 |
| methane sulfonic acid | 100 |
| 1-methyl-3-propylimidazole-2-thione | 60 |
| water | to 1 liter |
| Example 3 | |
| tin as stannous methane sulfonate | 10 |
| bismuth as bismuth methane sulfonate | 6 |
| methane sulfonic acid | 150 |
| 1-methyl-3-propylimidazole-2-thione | 80 |
| water | to 1 liter |
| Example 4 | |
| lead as plumbous fluoborate | 31 |
| fluoboric acid | 110 |
| 1-methyl-3-propylimidazole-2-thione | 60 |
| surfonic N-150 | 5 |
| water | to 1 liter |
| Example 5 | |
| lead as plumbous fluoborate | 25 |
| tin as stannous fluoborate | 10 |
| fluoboric acid | 100 |
| 1-methyl-3-propylimidazole-2-thione | 60 |
| water | to 1 liter |
| Example 6 | |
| bismuth as bismuth methane sulfonate | 6 |
| fluoboric acid | 100 |
| 1-methyl-3-propylimidazole-2-thione | 60 |
| water | to 1 liter |
| Example 7 | |
| tin as stannous fluoborate | 10 |
| fluoboric acid | 50 |
| methane sulfonic acid | 50 |
| 1-methyl-3-propylimidazole-2-thione | 40 |
| water | to 1 liter |

The following table contains further examples to illustrate the plating solutions of the preferred embodiments. In each Example, water is added to make 1 liter.

|  | 8 | 9 | 10 | 11 | 12 | 13 | 14 |
|---|---|---|---|---|---|---|---|
| Bismuth[1] | 6 | 10 | — | 10 | 10 | 10 | 10 |
| Tin[2] | — | — | — | 6 | — | 6 | — |
| Lead[3] | 6 | — | 25 | — | — | — | — |
| Fluoboric acid | 50 | — | 90 | — | — | — | — |
| Methane Sulfonic Acid | 50 | 120 | — | 150 | 100 | 130 | 100 |
| 1-methyl-3-propylimida-zole-2-thione | — | — | 30 | — | — | — | 50 |
| 1,3-dimethylimidazole-2-thione | 50 | 60 | 30 | — | — | 30 | — |
| 1-ethyl-3-propylimida-zole-2-thione | — | — | — | — | 60 | 30 | — |

[1]as bismuth methane sulfonate
[2]as stannous methane sulfonate
[3]as plumbous fluoborate An organosilane composition is used to bond the metal oxide, metal hydroxide, or combination thereof to one or more insulating layers. The organosilane may be placed on the metal oxide, metal hydroxide or combination thereof or an insulating layer. The organosilane compositions comprises a mixture of (i) at least one silane coupling agent and (ii) at least one member selected from the group consisting of a tris(silylorgano) amine, a tris(silylorgano)alkane, and a disysyl compound. In one embodiment, the organosilane compositions comprise (i) a mixture of at least one silane coupling agent and (ii) a tris(silylorgano)amine or alkane as described below. In another embodiment, the organosilane composition comprises (i) a mixture of an ureido silane and (ii) a disylyl compound as described hereinafter.

Silane coupling agents are well known, and various conventional silane coupling agents can be utilized. Examples of silane coupling agents include silane esters, amino silanes, amido silanes, ureido silanes, halo silanes, epoxy silanes, vinyl silanes, methacryloxy silanes, mercapto silanes, and isocyanato silanes. In one embodiment, the silane coupling agents are characterized by the formula, $$A_{(4-x)}\text{—Si—}(B)_x$$

wherein A is a hydrolyzable group, x is 1, 2 or 3, and B is a monovalent organic group. The A groups are groups which hydrolyze in the presence of water and may include acetoxy groups or alkoxy groups each containing up to 20 carbon atoms and chloro groups. In one preferred embodiment, x=1 and each A is an RO group such as represented by the formula, $$(RO)_3\text{—Si—B}$$

wherein each R is independently an alkyl, aryl, aralkyl or cycloalkyl group containing less than 20 carbon atoms, more often up to about 5 carbon atoms. The number of hydrolyzable groups A present in the silane coupling agent may be 1, 2 or 3 and is preferably 3 (i.e., x=1). Specific examples of RO groups include methoxy, ethoxy, propoxy, methylmethoxy, ethylmethoxy, phenoxy, etc.

The Group B above may be an alkyl or aryl group, or a functional group represented by the formula $$\text{—}C_nH_{2n}\text{—X}$$

wherein n is from 0 to 20 and X is selected from the group consisting of amino, amido, hydroxy, alkoxy, halo, mercapto, carboxy, acyl, vinyl, allyl, styryl, epoxy, isocyanato, glycidoxy and acryloxy groups. The alkyl and aryl groups may contain up to about 10 carbon atoms. Alkyl groups containing from 1 to about 5 carbon atoms are particularly useful. In one embodiment, n is an integer from 0 to 10 and more often from 1 to about 5.

The amino groups may contain one or more nitrogen atoms and, thus, may be monoamino groups, diamino groups, triamino groups, etc. General examples of diamino silane coupling agents can be represented by the formula $$(A)_3\text{Si—}R^1\text{—N}(R^2)\text{—}R^1\text{—N}(R^2)_2$$

wherein A is as defined above, each $R^1$ is independently a divalent hydrocarbyl group containing from 1 to about 5 carbon atoms, and each $R^2$ is independently hydrogen or an alkyl or an aryl group each containing up to about 10 carbon atoms. The divalent hydrocarbyl groups include methylene, ethylene, propylene, etc. Each $R^2$ is preferably hydrogen or a methyl or ethyl group.

The silane coupling agents which may contain amido groups include compositions represented by $A_{(4-x)}\text{—Si—}(B)_x$, wherein A and x are defined above, and Group B may be represented by the formulae $$\text{—}R^3\text{—C(O)—N}(R^4)_2$$

and $$\text{—}R^3\text{—N—}(R^4)\text{—C(O)—N}(R^4)_2$$

wherein each $R^3$ is independently a divalent hydrocarbyl group containing from 1 to 20 carbon atoms, more often from 1 to about 5 carbon atoms, and each $R^4$ is independently hydrogen or an alkyl or aryl group containing up to about 10 carbon atoms. Thus, the amido group may be an amide group or an ureido group. Generally, each $R^4$ in the formulae for the amido groups is hydrogen or an alkyl group containing from 1 to about 5 carbon atoms.

Specific examples of silane coupling agents useful in the first embodiment of the present invention include N-(2-aminoethyl)-3-aminopropyltrimethoxysilane, 3-methacryloxypropyltrimethoxysilane, 3-(2-(vinylbenzylamino)ethylamino)-propyltrimethoxysilane, 3-glycidoxypropyltrimethoxysilane, triacetoxyvinylsilane, tris-(2-methoxyethoxy)-vinylsilane, 3-chloropropyltrimethoxysilane, 1-trimethoxysilyl-2-(p,m-chloromethyl)phenylethane, 3-chloropropyltriethoxysilane, N-(aminoethylaminomethyl)phenyltrimethoxysilane, N-(2-aminoethyl)-3-aminopropyl tris(2-ethylhexoxy)silane, 3-aminopropyltrimethoxysilane, trimethoxysilylpropylenetriamine, β(3,4-epoxycyclohexyl) ethlytrimethoxysilane, 3-mercaptopropyltrimethoxysilane, 3-mercaptotriethoxysilane, 3-mercaptopropylmethyldimethoxysilane, bis(2-hydroxyethyl)-3-aminopropyltrimethoxysilane,1,3-divinyltetramethyldisilazane, vinyltrimethoxysilane, 2-(diphenylphospino)ethyltriethoxysilane, 2-methacryloxyethyldimethyl[3-trimethoxysilylpropyl] ammonium chloride, 3-isocyanatopropydimethylethoxysilane, N-(3-acryloxy-2-hydroxypropyl)-3-aminopropyltriethoxysilane, vinyl tris(t-butylperoxy)silane, methyltrimethoxysilane, ethyltrimethoxysilane, phenyltrimethoxysilane, phenyltriacetoxysilane, methyltrimethoxysilane, phenyltrimethoxysilane.

The preferred silane coupling agents are those which are commercially available and which are recognized by those skilled in the art as being effective coupling agents. A number of organofunctional silanes are available, for example, from Union Carbide, Specialty Chemicals Division, Danbury, Conn. Examples of useful silane coupling agents available from Union Carbide are summarized in the following table.

TABLE I

| Silane Coupling Agents | | |
|---|---|---|
| Type | Trade Designation | Formula |
| Esters | A-137 | $(EtO)_3SiC_8H_{17}$ |
|  | A-162 | $(EtO)_3SiCH_3$ |
| Amino | A-1100 | $(EtO)_3Si(CH_2)_3NH_2$ |
|  | A-1110 | $(MeO)_3Si(CH_2)_3NH_2$ |
|  | A-1120 | $(MeO)_3Si(CH_2)_3NH(CH_2)_2NH_2$ |
|  | A-1130 | $(MeO)_3Si(CH_2)_3NH(CH_2)_2NH(CH_2)_2NH_2$ |
| Ureido | A-1160* | $(EtO)_3Si(CH_2)_3NHC(O)NH_2$ |
| Isocyanato | A-1310 | $(EtO)_3Si(CH_2)_3N=C=O$ |
| Vinyl | A-151 | $(EtO)_3SiCH=CH_2$ |
|  | A-171 | $(MeO)_3SiCH=CH_2$ |
|  | A-172 | $(CH_3OC_2H_4O)_3SiCH=CH_2$ |
| Methacryloxy | A-174 | $(MeO)_3Si(CH_2)_3OC(O)C(CH_3)=CH_2$ |
| Epoxy | A-187 | $(MeO)_3Si(CH_2)_3OCH_2CH\text{—}CH_2$ (with epoxide O) |
| Mercapto | A-189 | $(MeO)_3Si(CH_2)_3SH$ |

*50% w/w in methanol

In one embodiment, the silane coupling agent is a ureido silane represented by the formula $$B_{(4-n)}\text{—Si—}(A\text{—N(H)—C(O)—NH}_2)_n$$

wherein A is an alkylene group containing from 1 to about 8 carbon atoms, B is a hydroxy or alkoxy group containing from 1 to about 8 carbon atoms and n is an integer from 1 to 3 provided that if n is 1 or 2, each B may be the same or different. In one embodiment, each B is an alkoxy group containing 1 to about 5 carbon atoms, particularly methyloxy or ethyloxy groups, and A is a divalent hydrocarbyl group containing from 1 to about 5 carbon atoms. Examples of such divalent hydrocarbyl groups include methylene, ethylene, propylene, butylene, etc. Specific examples of such ureido silanes include β-ureidoethyl-trimethoxysilane; β-ureidoethyl-triethoxysilane; γ-ureidoethyl-trimethoxysilane; γ-ureidopropyl-triethoxysilane, etc.

The second component in the organosilane compositions useful in the present invention is (1) a tris(silylorgano)amine characterized by the formula

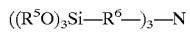

$((R^5O)_3Si\text{—}R^6\text{—})_3\text{—}N$ or (2) a tris(silylorgano)alkane characterized by the formula

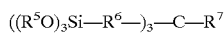

$((R^5O)_3Si\text{—}R^6\text{—})_3\text{—}C\text{—}R^7$ or, (3) a disylyl compound of the formula

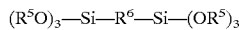

$(R^5O)_3\text{—}Si\text{—}R^6\text{—}Si\text{—}(OR^5)_3$ wherein each $R^5$ is independently an alkyl, alkoxyalkyl, aryl, aralkyl or cycloalkyl group of less than 20 carbon atoms; $R^6$ is a divalent hydrocarbon or polyether group of less than 20 carbon atoms; and $R^7$ is a functional group represented by $C_nH_{2n}X$ wherein n is from 0 to 20 and X is selected from the group consisting of amino, amido, hydroxy, alkoxy, halo, mercapto, carboxy, acyl, vinyl, allyl, styryl, epoxy, isocyanato, glycidoxy, and acryloxy groups. In one embodiment, each $R^5$ group is independently an alkyl, alkoxy alkyl, aryl, aralkyl or cycloalkyl group of less than 10 carbon atoms and is more often an alkyl group containing from 1 to 5 carbon atoms or an alkoxy alkyl group containing from 2 to 10 carbon atoms. $R^6$ is a divalent hydrocarbon or divalent polyether group containing less than 20, or up to about 8 carbon atoms. $R^6$ can be, for example, alkylene groups such as methylene, ethylene, propylene, ethylidene and isopropylidene; cycloalkylenes such as cycloheptylene and cyclohexylene; divalent aromatic groups such as phenylene, tolylene, xylylene, and naphthalene; and divalent groups of aralkanes of the formula, —C$_6$H$_4$—R'—, wherein R' is an alkylene group such as methylene, ethylene or propylene. $R^6$ also can be, for example, a divalent polyether of the formula —R$^8$—(O—R$^8$)$_z$— wherein R$^8$ is an alkylene group and z is an integer of from 1 to about 5. The divalent polyether group can be, for example, diethylene ether. In one embodiment, $R^7$ is defined the same as Group B above where group B is a functional group.

The tris(silylorgano)amines which are useful in the silane compositions are known compounds, and procedures for preparing such tris(silylorgano)amines have been described in, for example, U.S. Pat. Nos. 5,101,055; 2,920,095; and 2,832,754; and the disclosures of these patents with regard to the tris(silylorgano)amines and methods for preparing such amines are hereby incorporated by reference.

Specific examples of tris(silylorgano)amines which are useful in the silane compositions include tris(trimethoxysilylmethyl)amine; tris(triethoxysilylmethyl)amine; tris(trimethoxysilylethyl)amine; tris(trimethoxysilylethyl)amine; tris(trimethoxysilylethyl)amine; tris(triethoxysilylpropyl)amine; tris(dimethoxyethoxysilylpropyl)amine; tris(tripropoxysilylpropyl)amine; etc.

As described in U.S. Pat. No. 5,101,055, the tris(silylorgano)amines may be prepared from the corresponding bis-amine by contacting the bis-amine with particulate palladium monoxide at a temperature within the range of from about 50° C. to 300° C. Another procedure for preparing the tris(silylorgano)amine compounds utilizes the reaction of the bis(trialkoxysilylalkyl)amine with an equimolar amount of a trialkylsilylpropyl halide such as the chloride. For example, tris(trimethoxysilylpropyl)amine can be prepared by reacting bis(trimethoxysilylpropyl)amine with trimethoxysilylpropyl chloride. This process is a modification of the process described in U.S. Pat. No. 4,775,415 used for preparing bis(trimethoxysilylpropyl)amine from 3-aminopropyltrimethoxysilane and 3-chloro propyltrimethoxy silane.

The tris(silylorgano)compound utilized in the silane compositions of the present invention also may be an alkane characterized by the formula

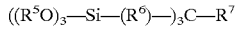

$((R^5O)_3\text{—}Si\text{—}(R^6)\text{—})_3C\text{—}R^7$ wherein $R^5$, $R^6$ and $R^7$ are defined above. Preferred examples of $R^5$ groups include methyl, ethyl, propyl, methoxymethyl, etc. The divalent hydrocarbon or divalent polyether group ($R^6$) may be any of the divalent hydrocarbon or polyether groups described above with respect to $R^6$. Preferred examples include methylene, ethylene, propylene, butylene, etc. Functional groups represented by $R^7$ may be any of the functional groups described above with respect to B in the silane coupling agent formula $A_{(4-x)}\text{—}Si\text{—}(B)_x$ above.

In another embodiment, the silane composition includes a disylyl compound, such as those represented by the above formula.

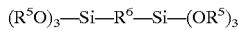

$(R^5O)_3\text{—}Si\text{—}R^6\text{—}Si\text{—}(OR^5)_3$ wherein $R^5$ and $R^6$ are defined above. Examples of these materials include bis(trimethoxysilyl) ethane, bis(triethoxysilyl) ethane, hexamethoxy disilylethane, etc. The disylyl compounds may be made by means known to those in the art. For instance, the disylyl compounds may be prepared by reacting a chloroalkyltrialkyoxysilane with a tetraalkoxysilane. U.S. Pat. No. 4,689,085, issued to Plueddemann, describes disylyl compounds and methods of their preparation. This paper is incorporated by reference for such disclosure.

The amounts of the silane coupling agent (i) and the tris(silylorgano)amine or alkane or disylyl compound (ii) utilized in the silane compositions may vary over a wide range. For example, the weight ratio of the silane-coupling agent (i) to the tris(silylorgano)amine or alkane or disylyl compound (ii) may range from about 1:99 and about 99:1. More often, the ratio, expressed as a mole ratio of (i):(ii), is in the range from about 1:1 to about 5:1.

The silane compositions may comprise other materials such as solvents, fillers, etc. Solvents should be capable of solubilizing both the silane coupling agent and the tris(silylorgano)amino or alkane or disylyl compound. Typically, such solvents include lower alcohols such as methanol, butanol or isopropanol. Water, or mixtures of water and alcohols can also be used as a solvent, but the stability of such solutions is generally more limited than the solutions made with alcohols. Small portions of water can be added to the silane compositions in order to hydrolyze the conventional silane coupling agent (A) and the tris (organosilyl)amine or alkane or disylyl compound. Alternatively, dispersions or emulsions of the silane compositions can be prepared in suitable organic solvent or mixtures of water and organic solvent. Typical solvents include, in addition to the alcohols described above, ethers, ketones, aliphatic and aromatic hydrocarbons, amides such as N,N-dimethylformamide, etc. Aqueous emulsions of the silane-coupling agents can be prepared in the conventional manner using conventional dispersants and surfactants, including nonionic surfactants.

The solids content of the silane compositions of the present invention may vary from 100% by weight in pure mixtures to as little as 0.1 weight percent or less in very dilute solutions or emulsions. More often, the solids content of solutions will be between about 0.5 and about 5% by weight.

A wide range of fillers can be included in the silane compositions. The fillers may be particulate or fibrous fillers, and these include siliceous materials, such as glass, quartz, ceramic, asbestos, silicone resin, glass fibers, metals, such as aluminum, steel, copper, nickel, magnesium and titanium, metal oxides such as magnesium oxide, iron oxide, and aluminum oxide, and metal fibers and metal-coated glass fibers. The amount of the filler included in the silane compositions may range from 0 to about 10% by weight. When the filler is present, it is more often present in amounts from about 0.1 to about 3% or 4% by weight.

The following examples illustrate particular embodiments of useful silane compositions.

|  | Pts./Wt. |
| --- | --- |
| Example 15 | |
| 3-methacryloxypropyltrimethoxy silane (A-174) | 75 |
| tris(trimethoxysilylpropyl)amine | 25 |
| Example 16 | |
| 3-methacryloxypropyltrimethoxy silane (A-174) | 75 |
| tris(trimethoxysilylpropyl)amine | 25 |
| methanol | 50 |
| Example 17 | |
| gamma-ureidopropyltriethoxysilane (A-1160) | 19.2 |
| tris(trimethoxysilylpropyl)amine | 7.2 |
| methanol | 74.6 |

The following table contains further examples of useful silane compositions. The amounts are in parts by weight.

| | Example | | | | | |
| --- | --- | --- | --- | --- | --- | --- |
| | 18 | 19 | 20 | 21 | 22 | 23 |
| Silane Coupling Agent (i) | | | | | | |
| 3-glycidoxypropyl trimethoxyysilane (A187) | 60 | — | — | 15 | — | — |
| vinyltrimethoxysilane (A-171) | — | 70 | — | — | 80 | — |
| Methyltriethoxysilane (A-162) | — | — | 25 | — | — | 50 |
| Silane Component (ii) | | | | | | |
| tris (trimethoxysilylpropyl)amine | 40 | — | — | — | — | 50 |
| tris (trimethoxysilylpropyl)ethane | — | 20 | — | 9 | — | — |
| bis (trimethoxysilyl)ethane | — | — | 12 | — | 20 | — |
| Methanol | — | 50 | 63 | 76 | — | — |

In practice, the silane compositions may be applied as a liquid solution or emulsion to the oxide or hydroxide layer, to the insulating layer, or to both layers. The silane compositions, particularly solutions and emulsions, can be applied to the surfaces by any conventional means such as by dipping, spraying, brushing, immersion, etc.

In another embodiment, the silane bonding mixture is placed on the insulating layer which may be a B-stage prepreg. The combination of the silane bonding layer and insulating layer is used to form the multilayer printed circuit boards. The B-stage prepreg is typically resin impregnated woven or non-woven layer or layers of fibers such as glass, cellulose (e.g. paper) and the like. The resins are thermosetting resins such as those used for the dielectric support described above. Examples of useful resins include epoxy resins, acrylic resins, butadiene terephthalate resins, polyester resins, fluorocarbon polymers, nylon polymers, polyimides, polycyanate ester resins, polybutadiene terphthalates and mixtures thereof.

The process of preparing the multilayer structure involves providing a dielectric containing copper circuitry. The copper circuitry may be provided on either side of the dielectric layer and may be a copper clad prepreg (having copper on both sides) available commercially from Polyclad Laminates, Inc., West Franklin, N.H. A layer of metal oxide, hydroxide, or combinations thereof is deposited on the copper circuitry from an aqueous electroless plating bath, described herein. In one embodiment of the process, the surface of the metal oxide, metal hydroxide or combination thereof is coated with a silane bonding mixture such as those described herein. An insulating layer is applied to the silane bonding mixture. A number of layers may be built up by repeating the process provided that at least one insulating layer is between each of the copper circuitry layers and that a metal oxide, metal hydroxide or combination thereof covers each of the copper circuitry layers. For instance, a copper clad prepreg having copper circuitry on both sides may be treated with a electroless plating bath to deposit a metal oxide, metal hydroxide or a combination thereof onto the copper circuitry. The silane bonding mixture may be applied to the surfaces of the metal oxide, metal hydroxide or combination thereof and an insulating layer is placed on each of the organosilane bonding mixture layers. Additional layers of organosilane bonding layer and copper circuitry coated with a metal oxide, metal hydroxide or combination thereof supported on a dielectric may be used to form a multilayered structure.

In a second embodiment, the organosilane bonding mixture is applied to one side of an insulating layer. The side of the insulating layer having the organosilane is then applied to the surface coating of a metal oxide, metal hydroxide or combination thereof which is on the copper circuitry on the dielectric. Like the first embodiment, additional layers may be applied to the structure by adding additional silane bonding mixture layers and copper circuitry layers, wherein the copper circuitry layers include a dielectric covered with copper circuitry whose surface is coated with an oxide, hydroxide or combination thereof of a metal.

The process may be repeated to make from about 2 to about 55 copper layers. The number of layers of copper is determined by counting the number of copper circuitry layers within a multilayer structure. In one embodiment, the interior copper layers of a multilayer printed circuit board are bonded with the silane bonding mixture. The outer most copper layers do not need to be bonded with a silane bonding material, although they may be bonded with the silane bonding material. As described above, the process is continued to form the preferred number of copper layers. In one embodiment, the multilayer circuit boards prepared by the present invention have copper layers from about 4 to about 25 copper layers.

After the multilayer structures are prepared as described above, the structures are placed into a hydraulic press and cured under pressure. Typically, a temperature of about 125° C. to about 250° C. and a pressure of about 200 to about 500 psi are used. U.S. Pat. Nos. 4,882,202 and 5,073,456, and "Printed Circuits Handbook", Third Edition, Edited by C. F. Loombe, Jr. McGraw-Hill, 1988 described methods of preparing printed circuit boards and such disclosures are incorporated by reference.

In addition to the method of preparing printed circuit boards, the invention also includes multilayer printed circuit boards.

In one embodiment as illustrated in FIG. 1, the multilayer printed circuit board 10, contains a dielectric layer 101 with copper circuitry 102 on one side of layer 101. The copper circuitry 101 is coated with a layer of metal oxide, metal hydroxide or combination thereof layer 103 derived from bismuth, lead, indium, gallium, germanium, alloys of said metals and alloys of said metals and tin and the metal oxide, metal hydroxide or combination thereof layer 103 is covered with a silane layer 104 and the insulating layer 105. The materials from FIG. 1 would be stacked on top of each other and bonded to form the printed circuit board.

Figure 1A:
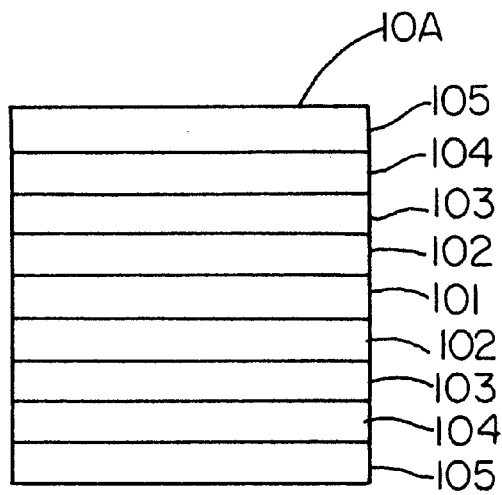
FIG. 1A is a cross-sectional area of one variation of FIG. 1.

The structure 10A illustrated in FIG. 1(A) is similar to that of FIG. 1 except that the dielectric layer 101 has a copper circuitry 102 on both sides, and the other layers described with respect to FIG. 1 (namely, 103, 104, and 105) are present on both sides of dielectric layer 101.

Figure 2:
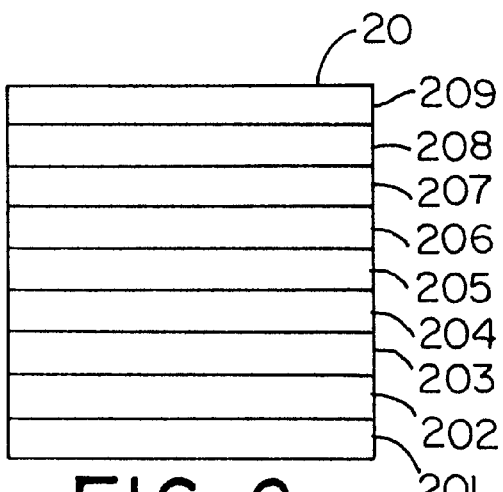
FIG. 2 is a cross-sectional area of a multilayer structure used to make a printed circuit board.

In FIG. 2, the printed circuit board 20, contains a dielectric layer 201 with copper circuitry 202 on one side of layer 201. The copper circuitry 202 is coated with a layer of metal oxide, metal hydroxide or combination thereof 203 derived from bismuth, lead, indium, gallium, germanium, alloys of said metals, and alloys of said metals and tin and the metal oxide, metal hydroxide or combination thereof layer 203 is covered with a silane layer 204 and the insulating layer 205. Insulating layer 205 is covered with silane layer 206 which is covered by a second layer of metal oxide, metal hydroxide or a combination thereof layer 207 which covers copper circuitry 208 which is on dielectric layer 209. This structure could then be combined with other structures to form a multilayer circuit board as is known to those in the art.

Figure 3:
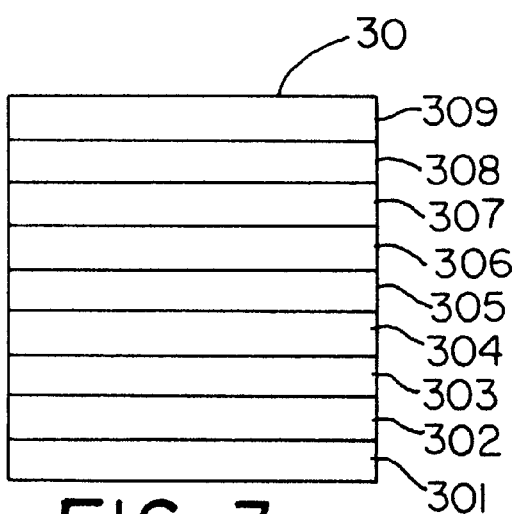
FIG. 3 is a cross-sectional area of a multilayer article used to form a printed circuit board.

The multilayer structure 30 illustrated in FIG. 3 comprises in sequence a first dielectric layer 301, a first layer of copper circuitry 302, a first layer of metal oxide, metal hydroxide or combination thereof layer 303, a first layer of an organosilane 304, an insulating layer 305, a second organosilane layer 306, a second layer of metal oxide, metal hydroxide or combination thereof layer 307, a second layer of copper circuitry 308 and a second dielectric layer 309. The respective first and second layers may be the same or different.

Figure 4:
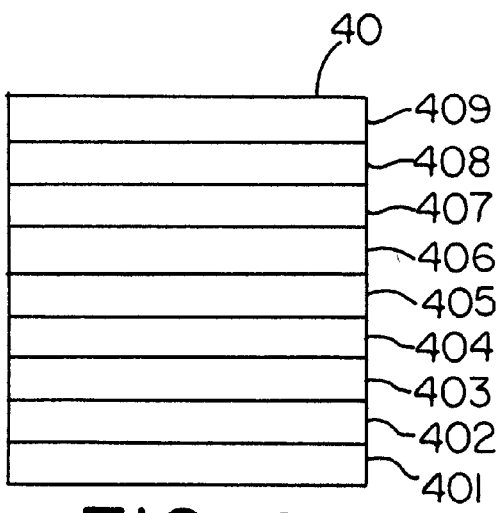
FIG. 4 is a cross-sectional area of a multilayer article used to form a printed circuit board.

In FIG. 4, the multilayer structure 40, has sequentially dielectric layer 401, copper circuitry 402, metal oxide, metal hydroxide or combination thereof layer 403, silane layer 404, an insulating layer 405, copper circuitry 406, metal oxide, metal hydroxide or a combination thereof layer 407, a silane layer 408, an insulating layer 409.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. A process of improving adhesion of copper circuitry to a dielectric layer, comprising the steps of:
   (A) providing a dielectric support having conductive copper circuitry on one or two opposite surfaces of the dielectric support;
   (B) forming, on the copper circuitry, a layer of an oxide, hydroxide, or combination thereof of a metal selected from the group consisting of tin, bismuth, lead, indium, gallium, germanium, and alloys of said metals, wherein the metal is deposited on the copper circuitry by application of an aqueous plating solution of said metals or alloys thereof onto the copper circuitry wherein said plating solution comprises:
      (B-1) at least one solution-soluble metal salt selected from the group consisting of a tin salt, a lead salt, a bismuth salt, an indium salt, a gallium salt and a germanium salt;
      (B-2) at least one acid selected from the group consisting of fluoboric acid, alkane sulfonic acids, alkanol sulfonic acids, and mixtures thereof;
      (B-3) a complexing agent which is an imidazole-2-thione compound of the Formula

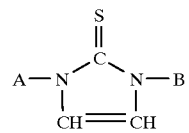

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and
      (B-4) water;
   and the metal so deposited is converted on its surface to an oxide hydroxide or combination thereof;
   (C) (i) applying, sequentially, an organosilane bonding mixture and an insulating layer to the surface the metal oxide, metal hydroxide, or combination thereof, or
      (ii) applying an insulating layer coated on one side with an organosilane bonding mixture to the surface of the metal oxide, metal hydroxide, or combination thereof, wherein the insulating layer comprises a partially cured thermosetting polymer composition, and wherein the organosilane coating is between the surface of the metal oxide, metal hydroxide, or combination thereof and the insulating layer and wherein the surface of the insulating layer opposite the organosilane bonding optionally contains copper circuitry,
   (D) bonding the combination from steps (A), (B), and (C), whereby during bonding, the partially cured insulating layer is cured.

2. The process of claim 1 wherein the dielectric layer contains an epoxy resin, a polyimide, a polycyanate ester, a butadiene terephthalate resin, and mixtures thereof.

3. The process of claim 1 wherein the acid (B-2) is an alkane sulfonic acid represented by the formula

wherein R is an alkyl group containing 1 to about 12 carbon atoms, or an alkanol sulfonic acid represented by the formula $$C_nH_{2n+1}-CH(OH)-(CH_2)_m-SO_3H$$

wherein n is from 0 to about 10, m is from 1 to about 11, and the sum of n+m is from 1 to about 12.

4. The process of claim 1 wherein the organosilane bonding mixture applied in step (C) comprises:

(i) a ureido silane having the structure $$B_{(4-n)}-Si-(A-N(H)-C(O)-NH_2)_n$$

wherein (A) is an alkylene group containing from 1 to about 8 carbon atoms, (B) is a hydroxy or alkoxy group containing from 1 to 8 carbon atoms, and n is an integer from 1 to 3 provided that if n is 1 or 2, each (B) may be the same or different; and (ii) a disylyl crosslinking agent having the structure $$(R^5O)_3-Si-R^6-Si-(OR^5)_3$$

wherein each $R^5$ is independently an alkyl group containing from 1 to about 8 carbon atoms, and $R^6$ is an alkylene group containing 1 to about 8 carbon atoms.

5. The process of claim 2 wherein the organosilane bonding mixture applied in step (C) comprises:

(i) a silane coupling agent; and (ii) a tris(silylorgano)amine or alkane characterized by the formulae $$((R^5O)_3-Si-R^6)_3-N$$

or $$((R^5O)_3-Si-R^6)_3-C-R^7$$

wherein each $R^5$ is independently an alkyl, alkoxyalkyl, aryl, aralkyl or cycloalkyl group of less than 20 carbon atoms; $R^6$ is a divalent hydrocarbon or polyether group of less than 20 carbon atoms; and $R^7$ is a functional group represented by $$C_nH_{2n}X$$

wherein n is from 0 to 20 and X is selected from the group consisting of amino, amido, hydroxy, alkoxy, halo, mercapto, carboxy, acyl, vinyl, allyl, styryl, epoxy, isocyanato, glycidoxy, and acryloxy groups.

6. A process for forming a multilayer printed circuit board containing conductive through-holes which make electrical connections to a series of electrically conducting layers through one or more insulating layers comprising the steps of:

(A) providing a dielectric layer having electrically conductive copper circuitry on one or two opposite surfaces of the dielectric layer support;

(B) forming on the copper circuitry, a layer of an oxide, hydroxide, or combination thereof of a metal selected from the group consisting of tin, bismuth, lead, indium, gallium, germanium, and alloys of said metals, wherein the metal is deposited on the copper circuitry by application of an aqueous plating solution of said metals or alloys thereof onto the copper circuitry wherein said plating solution comprises:

(B-1) at least one solution-soluble metal salt selected from the group consisting of a tin salt, a lead salt, a bismuth salt, an indium salt, a gallium salt and a germanium salt;

(B-2) at least one acid selected from the group consisting of fluoboric acid, alkane sulfonic acids, alkanol sulfonic acids, and mixtures thereof;

(B-3) a complexing agent which is an imidazole-2-thione compound of the Formula

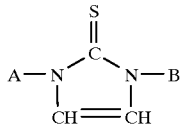

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (B-4) water;

and the metal so deposited is converted on its surface to an oxide hydroxide or combination thereof;

(C) (i) applying, sequentially, an organosilane bonding mixture and an insulating layer to the surface the metal oxide, metal hydroxide, or combination thereof, or (ii) applying an organosilane coated insulating layer coated on one side with an organosilane bonding mixture to the surface of the metal oxide, metal hydroxide, or combination thereof, wherein the insulating layer comprises a partially cured thermosetting polymer composition and wherein the organosilane coating is between the surface of the metal oxide, metal hydroxide, or combination thereof and the insulating layer and wherein the surface of the insulating layer opposite the organosilane bonding optionally contains copper circuitry, (D) repeating steps (A), (B) and (C) provided that when the insulating layer in step (C) has copper circuitry on the side opposite the organosilane at least one insulating layer separates the copper circuitry, and steps (B) and (C) are repeated, (E) bonding the materials formed in step (D) into a single article whereby an organosilane coating is between the layers of the metal oxide, metal hydroxide or combination thereof and the insulating layers and whereby during bonding, the partially cured insulating layers are cured;

(F) forming a number of holes through the bonded article formed in step (E); and (G) metallizing the walls of the through holes to form electrically conductive paths from opposite openings of the through holes to form a multilayer circuit board.

7. The process of claim 6 wherein the dielectric layer contains an epoxy resin, a polyimide, a polycyanate ester, a butadiene terephthalate resin, or mixtures thereof.

8. The process of claim 6 wherein the acid (B-2) is an alkane sulfonic acid represented by the formula $$R-SO_3H$$

wherein R is an alkyl group containing 1 to about 12 carbon atoms, or an alkanol sulfonic acid represented by the formula $C_nH_{2n+1}$—CH(OH)—$(CH_2)_m$—$SO_3H$ wherein n is from 0 to about 10, m is from 1 to about 11, and the sum of n+m is from 1 to about 12.

9. The process of claim 6 wherein the acid (B-2) is an alkane sulfonic acid.

10. The process of claim 6 wherein the acid (B-2) is a mixture of an alkane sulfonic acid and fluoboric acid.

11. The process of claim 6 wherein the acid (B-2) is methane sulfonic acid.

12. The process of claim 6 wherein A is methyl or ethyl and B is a $C_{3-6}$ alkyl or cycloalkyl group.

13. The process of claim 6 wherein the complexing agent B-3 is 1-methyl-3-propylimidazole-2-thione.

14. The process of claim 6 wherein the plating solution used in step (B) is substantially free of thiourea.

15. The process of claim 6 wherein the metal salt B-1is selected from the group consisting of tin, bismuth, lead, and alloys thereof.

16. The process of claim 15 wherein the plating solution comprises water-soluble salts of bismuth and tin, or lead and tin, or bismuth, lead and tin.

17. The process of claim 6 wherein the organosilane bonding mixture applied in step (C) comprises:

(i) a ureido silane having the structure $B_{(4-n)}$—Si—(A—N(H)—C(O)—$NH_2$)$_n$ wherein (A) is an alkylene group containing from 1 to about 8 carbon atoms, (B) is a hydroxy or alkoxy group containing from 1 to 8 carbon atoms, and n is an integer from 1 to 3 provided that if n is 1 or 2, each (B) may be the same or different; and (ii) a disylyl crosslinking agent having the structure $(R^5O)_3$—Si—$R^6$—Si—$(OR^5)_3$ wherein each $R^5$ is independently an alkyl group containing from 1 to about 8 carbon atoms, and $R^6$ is an alkylene group containing 1 to about 8 carbon atoms.

18. The process of claim 17 wherein the silane bonding mixture also contains a mutual solvent for the ureido silane and the crosslinking agent.

19. The process of claim 17 wherein the weight ratio of (i) to (ii) in the silane bonding mixture is between about 99:1 and about 1:99.

20. The process of claim 17 wherein (A) is an ethylene or propylene group.

21. The process of claim 17 wherein (B) is a methoxy or an ethoxy group.

22. The process of claim 17 wherein the ureido silane is gamma-ureidopropyl-triethoxysilane.

23. The process of claim 17 wherein each $R^5$ is independently a methyl or ethyl group.

24. The process of claim 17 wherein $R^6$ is an ethylene or propylene group.

25. The process of claim 17 wherein the disilyl crosslinking agent is hexamethoxy disilyethane.

26. The process of claim 6 wherein the organosilane bonding mixture applied in step (C) comprises:

(i) a silane coupling agent; and (ii) a tris(silylorgano)amine or alkane characterized by the formulae $((R^5O)_3$—Si—$R^6)_3$—N or $((R^5O)_3$—Si—$R^6)_3$—C—$R^7$ wherein each $R^5$ is independently an alkyl, alkoxyalkyl, aryl, aralkyl or cycloalkyl group of less than 20 carbon atoms; $R^6$ is a divalent hydrocarbon or polyether group of less than 20 carbon atoms; and $R^7$ is a functional group represented by $C_nH_{2n}X$ wherein n is from 0 to 20 and X is selected from the group consisting of amino, amido, hydroxy, alkoxy, halo, mercapto, carboxy, acyl, vinyl, allyl, styryl, epoxy, isocyanato, glycidoxy, and acryloxy groups.

27. The process of claim 26 wherein (i) is a tris (silylorgano)amine.

28. The process of claim 26 wherein each $R^5$ is independently an alkyl group.

29. The process of claim 26 wherein each $R^5$ is independently an alkyl group containing from 1 to 5 carbon atoms.

30. The process of claim 26 wherein $R^6$ is a divalent hydrocarbon group containing up to about 8 carbon atoms.

31. The process of claim 26 wherein the silane coupling agent (i) is characterized by the formula $A_{(4-x)}Si(B)_x$ wherein (A) is a hydrolyzable group, x is 1, 2 or 3, and (B) is an alkyl or aryl group or a functional group represented by the formula $C_nH_{2n}X$ wherein n is from 0 to 20 and X is selected from the group consisting of amino, amido, hydroxy, alkoxy, halo, mercapto, carboxy, acyl, vinyl, ally, styryl, epoxy, isocyanato, glycidoxy, and acryloxy groups.

32. The process of claim 31 wherein each A is an RO group wherein each R is independently an alkyl, aryl, aralkyl or cycloalkyl group containing less than 20 carbon atoms, and x=1.

33. The process of claim 32 wherein each R is an alkyl group containing up to about 5 carbon atoms.

34. The process of claim 31 wherein B is represented by the formula $C_nH_{2n}X$ wherein n is an integer from 1 to 5 and X is an amido group.

35. The process of claim 31 wherein B is an amino group.

36. The process of claim 26 wherein the mole ratio of the silane coupling agent (i) to the tris(sylylorgano)amine (ii) is in the range of about 1:1 to about 5:1.

37. A multilayer printed circuit board containing conductive through-holes which make electrical contact to a series of electrically conducting layers through one or more insulating layers comprising:

(A) a dielectric layer;

(B) a copper circuitry on one or two opposite sides of the dielectric layer;

(C) a layer of metal oxide, metal hydroxide, or combination thereof which overlays the copper circuitry wherein the metal is selected from the group consisting of bismuth, lead, indium, gallium, germanium, alloys of said metals and alloys of said metals with tin;

(D) an organosilane layer over the layer of metal oxide, metal hydroxide or combination thereof; and (E) an insulating layer comprising a cured thermosetting polymer composition over the organosilane layer.

38. The multilayer printed circuit board of claim 37 wherein the copper circuitry is on two opposite sides of the dielectric layer, and each copper circuitry is overlayed with a layer (C) of the metal oxide, metal hydroxide or combination thereof, an organosilane layer (D) and an insulating layer (E) comprising a cured thermosetting polymer composition.

39. A multilayer printed circuit board containing conductive through-holes which make electrical contact to a series of electrically conducting layers through several insulating layers comprising:

(A) a dielectric layer;

(B) a layer of copper circuitry on one or on two opposite sides of the dielectric layer;

(C) a layer of metal oxide, metal hydroxide, or combination thereof which overlays the copper circuitry wherein the metal is selected from the group consisting of bismuth, lead, indium, gallium, germanium, alloys of said metals and alloys of said metals and tin;

(D) an organosilane layer which overlays the layer of metal oxide, metal hydroxide or combination thereof;

(E) an insulating layer comprising a cured thermosetting polymer composition over the organosilane layer having copper circuitry on the side opposite the organosilane layer, (F) a second layer of metal oxide, hydroxide or combination thereof which overlays the second layer of copper circuitry wherein the metal is selected from the group consisting of bismuth, lead, indium, gallium, germanium, alloys of said metals and alloys of said metals and tin;

(G) a second organosilane layer which overlays the second layer of metal oxide, metal hydroxide or combination thereof; and (H) a second insulating layer comprising a cured thermosetting polymer composition over the organosilane layer provided that second layers (F) through (H) are optional when layers (B), (C), (D), (E) and (F) are present on opposite sides of the dielectric layer (A).

40. The multilayer printed circuit board of claim 39 wherein the copper circuitry has a thickness of at least about 2 microns.

41. The multilayer printed circuit board of claim 39 wherein the thickness of the layer of metal oxide, metal hydroxide or combination thereof is not greater than 1.5 mils.

42. The multilayer printed circuit board of claim 39 wherein the metal of the layer of metal oxide, metal hydroxide or combination thereof is selected from the group consisting of bismuth and bismuth alloys.

43. A multilayer printed circuit board containing conductive through-holes which make electrical contact to a series of electrically conducting layers through several insulating layers comprising in sequence:

(A) a dielectric layer;

(B) a layer of copper circuitry;

(C) a layer of metal oxide, metal hydroxide or combination thereof which overlays the copper circuitry wherein the metal is selected from the group consisting of bismuth, lead, indium, gallium, germanium, alloys of said metals and alloys of said metals and tin;

(D) an organosilane layer which overlays the layer of metal oxide, hydroxide or combination thereof;

(E) an insulating layer comprising a cured thermosetting polymer composition;

(F) a second organosilane layer;

(G) a second layer of a metal oxide, metal hydroxide, or combination thereof wherein the metal is selected from the group consisting of bismuth, lead, indium, gallium, germanium, alloys of said metals and alloys of said metals and tin;

(H) a second layer of copper circuitry; and (I) a second dielectric layer.

44. A multilayer printed circuit board containing conductive through-holes which make electrical contact to a series of electrically conducting layers through several insulating layers comprising in sequence:

(A) a dielectric layer;

(B) a layer of copper circuitry;

(C) a layer of metal oxide, or metal hydroxide, or combination thereof which overlays the copper circuitry wherein the metal is selected from the group consisting of bismuth, lead, indium, gallium, germanium, alloys of said metals and alloys of said metals and tin;

(D) an organosilane layer;

(E) an insulating layer comprising a cured thermosetting polymer composition;

(F) a second layer of copper circuitry;

(G) a second layer of metal oxide, hydroxide or combination thereof which overlays the second layer of copper circuitry wherein the metal is selected from the group consisting of bismuth, lead, indium, gallium, germanium, alloys of said metals and alloys of said metals and tin;

(H) a second organosilane layer; and (I) a second insulating layer comprising a cured thermosetting polymer composition.

* * * * *

UNITED STATES PATENT AND TRADEMARK OFFICE
CERTIFICATE OF CORRECTION

PATENT NO : 5,928,790
DATED : July 27, 1999
INVENTOR(S) : George S. Bokisa

It is certified that error appears in the above-identified patent and that said Letters Patent are hereby corrected as shown below:

Col. 22, line 42
 replace "ally"
 with --allyl--.

Col. 23, line 49
 replace "layers (B), (C), (D), (E) and (F) are"
 with --layers (B), (C), (D) and (E) are--.

Col. 23, line 57
 replace "mils"
 with --microns--.

Signed and Sealed this

Twenty-second Day of May, 2001

Attest:

NICHOLAS P. GODICI

Attesting Officer   Acting Director of the United States Patent and Trademark Office